(12) United States Patent
Li et al.

(10) Patent No.: US 12,538,607 B2
(45) Date of Patent: Jan. 27, 2026

(54) SOLAR CELL AND PREPARATION METHOD THEREOF

(71) Applicant: Trina Solar Co., Ltd., Jiangsu (CN)

(72) Inventors: Hongwei Li, Jiangsu (CN); Zibo Meng, Jiangsu (CN); Tingting Huo, Jiangsu (CN); Guangtao Yang, Jiangsu (CN); Xueling Zhang, Jiangsu (CN); Daming Chen, Jiangsu (CN)

(73) Assignee: Trina Solar Co., Ltd., Jiangsu (CN)

( * ) Notice: Subject to any disclaimer, the term of this patent is extended or adjusted under 35 U.S.C. 154(b) by 0 days.

(21) Appl. No.: 18/208,452

(22) Filed: Jun. 12, 2023

(65) Prior Publication Data

US 2023/0327030 A1    Oct. 12, 2023

(30) Foreign Application Priority Data

Oct. 28, 2022    (CN) .......................... 202211337692.X (51) Int. Cl.
   *H10F 77/30*     (2025.01)
   *H10F 10/14*     (2025.01)
   *H10F 71/00*     (2025.01)

(52) U.S. Cl.
   CPC ......... *H10F 77/311* (2025.01); *H10F 10/146* (2025.01); *H10F 71/121* (2025.01); *H10F 71/129* (2025.01)

(58) Field of Classification Search
   CPC ............ H01L 31/0682; H01L 31/0513; H01L 31/022441
   See application file for complete search history.

(56) References Cited

U.S. PATENT DOCUMENTS

2014/0224307 A1*    8/2014    Chen .................... H10F 10/146
                                                                   136/255
2015/0072467 A1    3/2015    Chan et al.
(Continued)

FOREIGN PATENT DOCUMENTS

CN    202210522 U    5/2012
CN    103346211 A    10/2013
(Continued)

OTHER PUBLICATIONS

Machine translation of Yang (KR 20200089967 A) was provided by the EPO website, 2025, All Pages. (Year: 2025).*
(Continued)

*Primary Examiner* — Daniel P Malley, Jr.
(74) *Attorney, Agent, or Firm* — HOUTTEMAN LAW LLC (57) ABSTRACT

A solar cell and preparation method. The solar cell includes silicon substrate having first or second polarity, where the substrate includes first and second sides opposite to each other; first passivation structure on first side of the substrate, a portion of first structure farthest from the substrate having first polarity and a position where first structure is located being first electrode region; second passivation structure on a side of first structure away from the substrate, a portion of second structure farthest from the substrate having second polarity and a position where second structure is located being second electrode region, second and first electrode regions are not overlapped and second structure has a process temperature lower than first structure; and first electrode in first region on a side of second structure away from the substrate and second electrode in second region on a side of second structure away from the substrate.

18 Claims, 3 Drawing Sheets

(56) References Cited

U.S. PATENT DOCUMENTS

| | | | |
|---|---|---|---|
| 2023/0088548 A1* | 3/2023 | Yu | H01L 31/1804 136/243 |
| 2024/0097060 A1* | 3/2024 | Lin | H01L 31/0682 |

FOREIGN PATENT DOCUMENTS

| | | |
|---|---|---|
| CN | 105118870 A | 12/2015 |
| CN | 108649079 A | 10/2018 |
| CN | 110634961 A | 12/2019 |
| CN | 113921625 A | 1/2022 |
| CN | 114300546 A | 4/2022 |
| CN | 114695573 A | 7/2022 |
| CN | 115207137 A | 10/2022 |
| DE | 102014218948 A1 | 3/2016 |
| EP | 3018716 A1 | 5/2016 |
| JP | 2008519438 A | 6/2008 |
| JP | 2015514314 A | 5/2015 |
| JP | 2017005253 A | 1/2017 |
| JP | 2017520920 A | 7/2017 |
| KR | 20200089967 A * | 7/2020 ............ H10F 10/16 |
| WO | WO 2016068711 A2 | 5/2016 |

OTHER PUBLICATIONS

European Patent Office, EP23186644.3 Extended European Search Report issued on Mar. 25, 2024.
Japanese Patent Office, JP2023-081303 First Office Action issued on Feb. 27, 2024.
China Patent Office, CN202211337692.X First Office Action issued on Dec. 21, 2024.
Japan Patent Office, JP2023-081303 Third Office Action issued on Nov. 5, 2024.
Australia Patent Office, Second Office Action dated Apr. 11, 2020, for corresponding AU application No. 2023208080.
Australia Patent Office, Notice of Acceptance dated May 15, 2025, for corresponding AU application No. 2023208080.
Japan Patent Office, Decision of Rejection dated Apr. 22, 2025, for corresponding JP application No. 2023-081303.
China Patent Office, Second Office Action dated May 14, 2025 for corresponding CN application No. 202211337692.X.

* cited by examiner

SOLAR CELL AND PREPARATION METHOD THEREOF

CROSS-REFERENCE TO RELATED APPLICATION

This application claims benefits of the priority of Chinese Patent Application No. No. 202211337692.X filed on Oct. 28, 2022, titled "SOLAR CELL AND PREPARATION METHOD THEREOF" in the China National Intellectual Property Administration, the entire content of which is incorporated herein by reference.

TECHNICAL FIELD

The present disclosure relates to the technical fields of solar cells, and in particular, to a solar cell and a preparation method thereof.

BACKGROUND

In a Heterojunction Back Contact (HBC) solar cell, an intrinsic a-Si layer is disposed on a back side (a side facing away from a light incident side) of a silicon substrate, while a base electrode and an emitter electrode are disposed on a side of the intrinsic a-Si layer away from the silicon substrate, and different polarities are doped on a surface of the intrinsic a-Si layer corresponding to different electrodes, respectively.

SUMMARY

The present disclosure provides a solar cell with a novel structure and a preparation method thereof.

In a first aspect, an embodiment of the present disclosure provides a solar cell, including:
- a silicon substrate having a first polarity or a second polarity, wherein the silicon substrate includes a first side and a second side opposite to each other; the first polarity is used for transporting one of electrons and holes, and the second polarity is used for transporting the other of electrons and holes;
- a first passivation structure on the first side of the silicon substrate, wherein a portion of the first passivation structure farthest from the silicon substrate has a first polarity; and a position where the first passivation structure is located is a first electrode region;
- a second passivation structure on a side of the first passivation structure away from the silicon substrate, wherein a portion of the second passivation structure farthest from the silicon substrate has a second polarity; and a position where the second passivation structure is located is a second electrode region, the second electrode region is not overlapped with the first electrode region, and the second passivation structure has a process temperature lower than the first passivation structure; and
- a first electrode in the first electrode region on a side of the second passivation structure away from the silicon substrate, and a second electrode in the second electrode region on a side of the second passivation structure away from the silicon substrate.

Optionally, the second passivation structure is located in the second electrode region.

Optionally, the first passivation structure includes:
- a tunneling passivation sublayer; and
- a first passivation sublayer on a side of the tunneling passivation sublayer away from the silicon substrate, wherein the first passivation sublayer has the first polarity.

Optionally, the tunneling passivation sublayer is made of a material including at least one of silicon oxide, aluminum oxide, silicon oxynitride or silicon carbide; and
the first passivation sublayer is made of a material including at least one of doped polysilicon or doped silicon carbide.

Optionally, the tunneling passivation sublayer has a thickness ranging from 1 nm to 3 nm; and
the first passivation sublayer has a thickness ranging from 10 nm to 200 nm.

Optionally, the second passivation structure includes:
- a dielectric passivation sublayer; and
- a second passivation sublayer on a side of the dielectric passivation sublayer away from the silicon substrate, wherein the second passivation sublayer has the second polarity.

Optionally, the dielectric passivation sublayer is made of a material including at least one of polysilicon, amorphous silicon or silicon oxide; and
the second passivation sublayer is made of a material including at least one of doped polysilicon, doped amorphous silicon or doped silicon carbide.

Optionally, the dielectric passivation sublayer has a thickness ranging from 1 nm to 15 nm; and
the second passivation sublayer has a thickness ranging from 1 nm to 20 nm.

Optionally, the first electrode region includes a plurality of strip-shaped regions spaced apart, the second electrode region includes a plurality of strip-shaped regions spaced apart, and the strip-shaped regions in the first electrode region and the strip-shaped regions in the second electrode region are alternately distributed.

Optionally, the first passivation structure has a process temperature ranging from 300° C. to 650° C.; and the second passivation structure has a process temperature ranging from 150° C. to 200° C.

In a second aspect, an embodiment of the present disclosure provides a method for preparing a solar cell, wherein the solar cell is a solar cell according to any embodiment of the present disclosure, and the method includes:
- forming a first passivation structure in a first electrode region on a first side of the silicon substrate through a patterning process;
- forming a second passivation structure in a second electrode region on a first side of the silicon substrate through a patterning process; and
- forming a first electrode in a first electrode region and a second electrode in a second electrode region on the first side of the silicon substrate through a patterning process.

It can be seen that in the embodiments of the present disclosure, both electrodes are disposed on the back side of the silicon substrate, and passivation layers (the first passivation structure and the second passivation structure) with different polarities are disposed on the silicon substrate at positions corresponding to the two electrodes, respectively, so that a novel form of hybrid HBC solar cell is provided.

Reference numerals: 1. First passivation structure; 11. Tunneling passivation sublayer; 12. First passivation sublayer; 2. Second passivation structure; 21. Dielectric passivation sublayer; 22. Second passivation sublayer; 31. Front dielectric passivation layer; 32. Antireflection layer; 51. N-type doped region; 52. P-type doped region; 59. intrinsic a-Si layer; 81. First electrode; 82. Second electrode; 89. Transparent conductive oxide layer; 9. Silicon substrate; 91. First electrode region; and 92. Second electrode region.

DETAIL DESCRIPTION OF EMBODIMENTS

To improve understanding of the technical solution of the present disclosure for those skilled in the art, the present disclosure will be described in detail with reference to accompanying drawings and specific implementations.

It will be appreciated that the specific embodiments and drawings described herein are used merely for the purpose of explaining the present disclosure instead of limiting the present disclosure.

It will be appreciated that embodiments of the present disclosure and features thereof may be combined with each other as long as they are not contradictory.

It will be appreciated that, for convenience of description, only parts related to embodiments of the present disclosure are shown in the drawings, and parts not related to embodiments of the present disclosure are not shown in the drawings.

In the embodiments of the present disclosure, the terms "first polarity" and "second polarity" refer to two semiconductor types; that is, the first polarity and the second polarity are P-type (transporting holes) and N-type (transporting electrons) respectively and non-repetitively. For example, the first polarity may be P-type and the second polarity may be the N-type, or the first polarity may be the N-type and the second polarity may be P-type.

In the embodiments of the present disclosure, the phrase "A is on a side of B away from C" means that A and B are both formed on a same side of C, and A is formed after B, so that A covers B at a position with both A and B. However, it does not mean that all positions of A necessarily cover B, nor that all positions of B are covered with A.

In the embodiments of the present disclosure, the phrase "process temperature of a structure" refers to the maximum temperature to be reached in formation of the structure.

In the embodiments of the present disclosure, the phrase "patterning process" refers to a process for forming a structure having a specific pattern, which may specifically include a photolithography process, a laser process, a wet film etching process, or the like.

Figure 1:
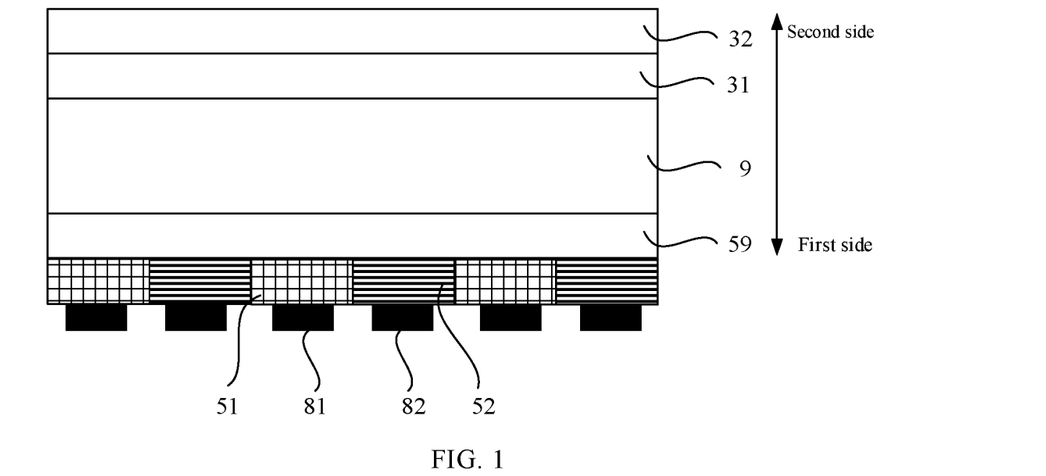
FIG. 1 is a schematic structural diagram of an HBC solar cell in related arts.

Referring to FIG. 1, a Heterojunction Back Contact (HBC) solar cell includes a silicon substrate 9. An intrinsic a-Si layer 59 is disposed on a back side (a first side) of the silicon substrate 9, while N-type doped regions 51 and P-type doped regions 52 are alternately formed on a surface of the intrinsic a-Si layer 59 to transport holes and electrons, respectively, and different types of electrodes, i.e., a first electrode 81 (e.g., a base electrode) and a second electrode 82 (e.g., an emitter electrode) arranged in an interdigitated manner are disposed on a side of the two types of doped regions away from the silicon substrate 9.

A front dielectric passivation layer 31, an antireflection layer 32, and other structures may be further disposed sequentially on a light incident side (a second side) of the silicon substrate 9.

As can be seen, in the HBC solar cell, the PN junction, and also the base electrode and the emitter electrode, are all located on the back side so that no electrode is provided on the light incident side of the HBC solar cell, and thus light will not be shielded by electrodes. Therefore, the HBC solar cell has smaller optical loss, higher short-circuit current density, higher efficiency and better performance.

Figure 2:
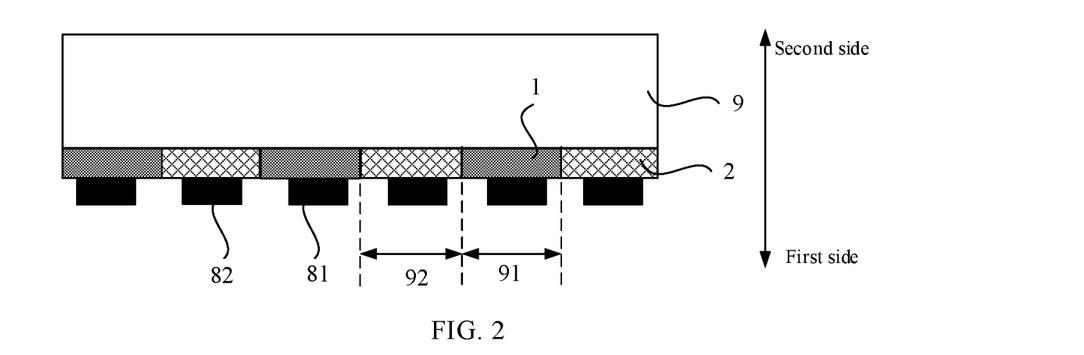
FIG. 2 is a schematic sectional view of a solar cell according to an embodiment of the present disclosure.
Figure 3:
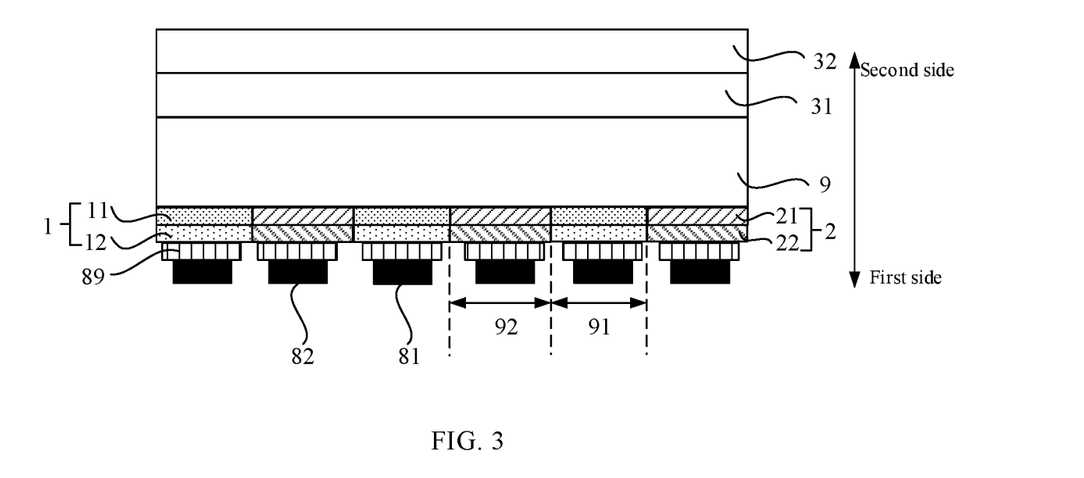
FIG. 3 is a schematic sectional view of another solar cell according to an embodiment of the present disclosure.
Figure 4:
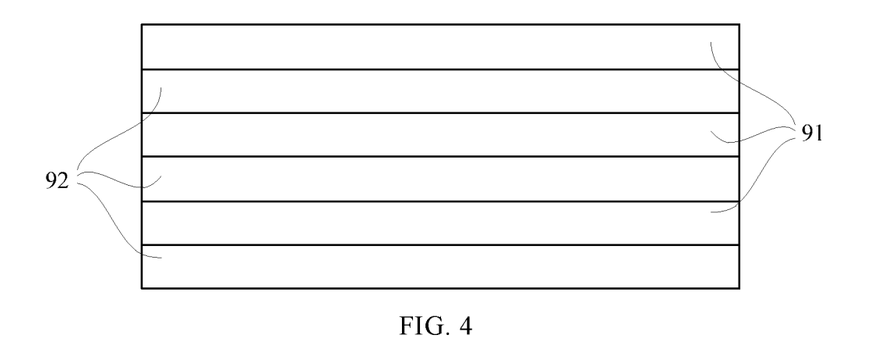
FIG. 4 is a schematic diagram illustrating a distribution of electrode regions in a solar cell according to an embodiment of the present disclosure.

In a first aspect, referring to FIGS. 2 to 4, an embodiment of the present disclosure provides a solar cell, including:

a silicon substrate 9 having a first polarity or a second polarity, where the silicon substrate 9 includes a first side and a second side opposite to each other; the first polarity is used for transporting one of electrons and holes, and the second polarity is used for transporting the other of electrons and holes;

a first passivation structure 1 on the first side of the silicon substrate 9, where a portion of the first passivation structure 1 farthest from the silicon substrate 9 has a first polarity; and a position where the first passivation structure 1 is located is a first electrode region 91;

a second passivation structure 2 on a side of the first passivation structure 1 away from the silicon substrate 9, where a portion of the second passivation structure 2 farthest from the silicon substrate 9 has a second polarity, and a position where the second passivation structure 2 is located is a second electrode region 92, the second electrode region 92 is not overlapped with the first electrode region 91, and the second passivation structure 2 has a process temperature lower than the first passivation structure 1; and a first electrode 81 in the first electrode region 91 on a side of the second passivation structure 2 away from the silicon substrate 9, and a second electrode 82 in the second electrode region 92 on a side of the second passivation structure 2 away from the silicon substrate 9.

Referring to FIG. 2, the solar cell according to the embodiment of the present disclosure has a silicon substrate 9 with a certain polarity (a first polarity or a second polarity), which is a P-type doped or N-type doped silicon-based semiconductor.

Referring to FIG. 2, the silicon substrate 9 has a first side and a second side opposite to each other. The second side may be a "light incident side" for light incidence, and the first side may be a "back side" opposite to the light incident side.

Referring to FIGS. 2 and 4, one part of a surface on the first side of the silicon substrate 9 is a first electrode region 91 for disposing the first electrode 81, and the other part is a second electrode region 92 for disposing the second electrode 82.

It will be appreciated that the first electrode region 91 and the second electrode region 92 are different regions, i.e., may be non-overlapping; and further, the first electrode region 91 and the second electrode region 92 may "completely cover" the first side of the silicon substrate 9.

It will be appreciated that it is also possible that the first electrode region 91 and the second electrode region 92 do not completely cover the first side of the silicon substrate 9.

Optionally, the first electrode region 91 includes a plurality of strip-shaped regions spaced apart, the second electrode region 92 includes a plurality of strip-shaped regions spaced apart, and the strip-shaped regions of the first electrode region 91 and the strip-shaped regions of the second electrode region 92 are alternately distributed.

As an implementation of the embodiment of the present disclosure, referring to FIG. 4, the first electrode region 91 may include a plurality of strips parallel to and spaced apart from each other, the second electrode region 92 may also include a plurality of strips parallel to and spaced apart from each other, and the strips of the two electrode regions are parallel to each other and alternately distributed along a width direction of the stripes (apparently, the stripes of the two electrode regions may contact each other on sides, as shown in FIG. 4, or may be spaced apart from each other by a certain distance). As a result, the first electrode 81 and the second electrode 82 in the first electrode region 91 and the second electrode region 92, respectively, are distributed in an "interdigitated" manner.

Referring to FIG. 2, a first passivation structure 1 (passivation layer) in the first electrode region 91 is disposed on the first side of the silicon substrate 9. In other words, the first passivation structure 1 is "patterned", and a position where the first passivation structure 1 is located is the first electrode region 91 (therefore, the first passivation structure 1 completely covers, but does not exceed, the first electrode region 91). Further, the first passivation structure 1 has a polarity (first polarity), which is the same as or opposite to the polarity of the silicon substrate 9, in at least a surface layer farthest from the silicon substrate 9.

Referring to FIG. 2, a second passivation structure 2 is further disposed on a side of the first passivation structure 1 away from the silicon substrate 9 and in the second electrode region 92. In other words, the second passivation structure 2 is also "patterned", and a position where the second passivation structure 2 is located is the second electrode region 92 (therefore, the second passivation structure 2 completely covers, but does not exceed, the second electrode region 92).

Moreover, since the first passivation structure 1 and the first passivation structure 2 are located at different electrode regions, there is no overlap therebetween. For example, if the first electrode region 91 and the second electrode region 92 "completely cover" the first side of the silicon substrate 9, since the first passivation structure 1 and the second passivation structure 2 fill the first electrode region 91 and the second electrode region 92, respectively, referring to FIG. 2, the two passivation structures may contact each other on sides.

Moreover, the second passivation structure 2 has a polarity (second polarity), which is "opposite" to that of the first passivation structure 1, in at least a surface layer farthest from the silicon substrate 9. For example, if the first passivation structure 1 is P-type, the second passivation structure 2 is the N-type, and if the first passivation structure 1 is the N-type, the second passivation structure 2 is P-type. Therefore, one of the first passivation structure 1 and the second passivation structure 2 has the same polarity as the silicon substrate 9, while the other has an opposite polarity to the silicon substrate 9.

That is, referring to FIG. 2, the first passivation structure 1 and the second passivation structure 2 are disposed in the first electrode region 91 and the second electrode region 92, respectively, on the first side of the silicon substrate 9, and the first electrode 81 and the second electrode 82 are disposed on the first passivation structure 1 and the second passivation structure 2, respectively. Moreover, the first passivation structure 1 and the second passivation structure 2 have opposite polarities, one has the same polarity as the silicon substrate 9, and the other has an opposite polarity to the silicon substrate 9.

Thereby, one of the first passivation structure 1 and the second passivation structure 2 may form a tunneling junction on the back side of the silicon substrate 9.

The first passivation structure 1 and the second passivation structure 2 are distinguished through a comparison of their respective process temperatures. That is, the second passivation structure 2 has a lower process temperature than the first passivation structure 1. Therefore, the first passivation structure 1 is a high-temperature passivation structure (high-temperature passivation layer) having a higher process temperature, while the second passivation structure 2 is a low-temperature passivation structure (low-temperature passivation layer) having a lower process temperature.

It will be appreciated that although the second passivation structure 2 and the first passivation structure 1 are not overlapped with each other (i.e., the second passivation structure 2 is not "pressed" on the first passivation structure 1), an order of formation of the second passivation structure 2 and the first passivation structure 1 may be determined from the structure of the solar cell product. If the first passivation structure 1 is formed first, heating in subsequent formation of the second passivation structure 2 will not affect the already formed first passivation structure 1; but if the second passivation structure 2 is formed first, heating in subsequent formation of the first passivation structure 1 may damage the already formed second passivation structure 2.

Optionally, the first passivation structure 1 has a process temperature ranging from 300° C. to 650° C.; and the second passivation structure 2 has a process temperature ranging from 150° C. to 200° C.

As an implementation of the embodiment of the present disclosure, a maximum temperature (process temperature) in formation of the first passivation structure 1 may be 300° C. to 650° C., or further 400° C. to 600° C. Accordingly, a maximum temperature (process temperature) in formation of the second passivation structure 2 may be 150° C. to 200° C., or further 170° C. to 190° C.

Referring to FIG. 2, a first electrode 81 that does "not exceed" the first electrode region 91 is disposed on a side of the second passivation structure 2 away from the silicon substrate 9. In other words, the first electrode 81 is in communication with the silicon substrate 9 through the first passivation structure 1. Further, a second electrode 82 that does "not exceed" the second electrode region 92 is disposed on a side of the second passivation structure 2 away from the silicon substrate 9. In other words, the second electrode 82 is in conduction with the silicon substrate 9 through the second passivation structure 2.

One of the first electrode 81 and the second electrode 82 is an emitter electrode, and the other is a base electrode.

Further, an electrode on the passivation structure having the same polarity as the substrate 9 is the base electrode, and an electrode on the passivation structure having the opposite polarity to the substrate 9 is the emitter electrode.

It will be appreciated that different types of electrodes cannot contact each other.

It can be seen that in the embodiment of the present disclosure, both electrodes are disposed on the back side of the silicon substrate 9, and passivation layers (the first passivation structure 1 and the second passivation structure 2) with different polarities are disposed on the silicon substrate 9 at positions corresponding to the two electrodes, respectively, so that a novel form of hybrid HBC solar cell is provided.

Optionally, the first passivation structure 1 includes:
a tunneling passivation sublayer 11; and
a first passivation sublayer 12 on a side of the tunneling passivation sublayer 11 away from the silicon substrate 9, where the first passivation sublayer 12 has the first polarity.

Referring to FIG. 3, as an implementation of the embodiment of the present disclosure, the first passivation structure 1 may specifically include two sublayers, i.e., a tunneling passivation sublayer 11 contacting the silicon substrate 9, and a first passivation sublayer 12 on the tunneling passivation sublayer 11. At least the first passivation sublayer 12 has a first polarity opposite to the second passivation structure 2, e.g., a doped P-type or N-type.

It will be appreciated that the tunneling passivation sublayer 11 and the first passivation sublayer 12 are both patterned and have a same pattern.

Optionally, the tunneling passivation sublayer 11 is made of a material including at least one of silicon oxide, aluminum oxide, silicon oxynitride or silicon carbide; and
the first passivation sublayer 12 is made of a material including at least one of doped polysilicon or doped silicon carbide.

As an implementation of the embodiment of the present disclosure, in the first passivation structure 1, the tunneling passivation sublayer 11 may be made of a material selected from SiOx, AlOx, SiNOx, SiCx, or any other dielectric material. The tunneling passivation sublayer 11 may be free-dopant and thus may have no polarity.

The first passivation sublayer 12 in the first passivation structure 1 has a first polarity opposite to the second passivation structure 2, which may be specifically a P-type or N-type doped polysilicon, silicon carbide or the like.

For example, if the first polarity is P-type, the first passivation sublayer 12 may be doped with a group III element, such as boron (B); if the first polarity is N-type, the first passivation sublayer 12 may be doped with a V group element, such as phosphorus (P).

With the doped polysilicon, silicon carbide, or the like in the first passivation sublayer 12, optical absorption can be further reduced, while effective doping of a higher concentration can be implemented, thereby reducing the contact resistance of the electrode and improving the cell fill factor.

Optionally, the tunneling passivation sublayer 11 has a thickness ranging from 1 nm to 3 nm; and
the first passivation sublayer 12 has a thickness ranging from 10 nm to 200 nm.

As an implementation of the embodiment of the present disclosure, the tunneling passivation sublayer 11 in the first passivation structure 1 may have a thickness (a dimension in a direction perpendicular to the first side of the silicon substrate 9) ranging from 1 to 3 nm, and further from 1.5 to 2 nm; and the first passivation sublayer 12 may have a thickness ranging from 10 to 200 nm, and further from 80 to 120 nm.

Optionally, the second passivation structure 2 includes:
a dielectric passivation sublayer 21; and
a second passivation sublayer 22 on a side of the dielectric passivation sublayer 21 away from the silicon substrate 9, where the second passivation sublayer 22 has the second polarity.

Referring to FIG. 3, as an implementation of the embodiment of the present disclosure, the second passivation structure 2 may also include two sublayers, i.e., a dielectric passivation sublayer 21 close to the silicon substrate 9, and a second passivation sublayer 22 on the dielectric passivation sublayer 21. At least the second passivation sublayer 22 has a second polarity opposite to the first passivation structure 1.

It will be appreciated that the dielectric passivation sublayer 21 and the second passivation sublayer 22 are both patterned and have a same pattern.

Optionally, the dielectric passivation sublayer 21 is made of a material including at least one of polysilicon, amorphous silicon or silicon oxide; and
the second passivation sublayer 22 is made of a material including at least one of doped polysilicon, doped amorphous silicon or doped silicon carbide.

As an implementation of the embodiment of the present disclosure, the dielectric passivation sublayer 21 may be specifically made of a material including amorphous silicon, polysilicon (poly-Si, which may be specifically microcrystalline silicon, nanocrystalline silicon) or the like, and may be a single layer or a stacked structure of layers of various different materials.

The dielectric passivation sublayer 21 may be non-polar, i.e., an intrinsic free-dopant layer.

The second passivation sublayer 22 has an opposite polarity to the first passivation structure 1, and may be, for example, made of a material including doped polysilicon, amorphous silicon, silicon carbide, or the like, where the doped element may be a group III element (e.g., boron) or a group V element (e.g., phosphorus), or the like.

Optionally, the dielectric passivation sublayer 21 has a thickness ranging from 1 nm to 15 nm; and
the second passivation sublayer 22 has a thickness ranging from 1 nm to 20 nm.

As an implementation of the embodiment of the present disclosure, in the second passivation structure 2, the dielectric passivation sublayer 21 may have a thickness ranging from 1 to 15 nm, and further from 5 to 8 nm; and the second passivation sublayer 22 may have a thickness ranging from 1 to 20 nm, and further from 5 to 15 nm.

It will be appreciated that the above is merely an exemplary introduction of some structures of the solar cell according to the embodiments of the present disclosure, and the solar cell according to the embodiments of the present disclosure may further satisfy other characteristics.

For example, the silicon substrate 9 may be in the form of monocrystalline silicon, polysilicon, or the like, and doped to produce a desired polarity.

For another example, a textured surface (light trapping surface) may be formed on the second side (light incident side) of the silicon substrate 9 to increase absorption of light.

For another example, referring to FIG. 3, a complete front dielectric passivation layer 31, which may be specifically made of the same material as the second passivation sublayer 22 in the second passivation structure 2, may be formed on the second side of the silicon substrate 9, For another example, referring to FIG. 3, an antireflection layer 32 may be further formed on the second side of the silicon substrate 9 (e.g., outside the front dielectric passivation layer 31) to reduce light emission. The antireflection layer 32 may also serve as a protective layer (AR film) that may be specifically made of a material including one or more of silicon oxide, silicon nitride, silicon oxynitride, or the like, and may be a single layer or a stacked structure of multiple layers with different refractive indexes.

For another example, referring to FIG. 3, a transparent conductive oxide (TCO) layer 89 for improving the contact resistance may be further provided between the electrode and the second passivation structure 2. The TCO layer 89 may be, for example, a single layer of ITO, IWO, AZO, ICO, IMO, IHO, SCOT or the like, or a stacked structure of multiple layers of different materials.

Referring to FIG. 3, in order to prevent the transparent conductive oxide layer 89 from conducting different electrodes, a gap may be provided between transparent conductive oxide layers 89 in different electrode regions.

For another example, referring to FIG. 3, the first electrode 81 and the second electrode 82 may be disposed in a same layer (made simultaneously of a same material), and made of a metal material including silver, copper, aluminum, tin-clad copper, silver-clad copper, or may be composite electrodes made of various materials including nickel, copper, aluminum, tin or the like.

In a second aspect, referring to FIGS. 2 to 9, an embodiment of the present disclosure provides a method for preparing a solar cell, where the solar cell is a solar cell according to any embodiment of the present disclosure.

The method provided in the embodiment of the present disclosure is used for preparing the solar cell as described above.

Figure 5:
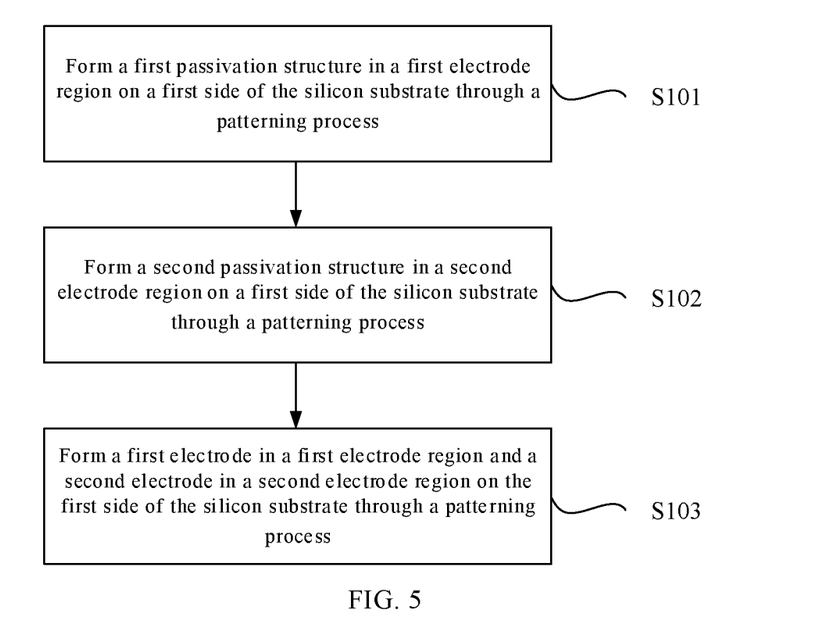
FIG. 5 is a flowchart of a method for preparing a solar cell according to an embodiment of the present disclosure.

Referring to FIG. 5, a method for preparing a solar cell according to an embodiment of the present disclosure includes the following steps S101 to S103.

At S101, forming a first passivation structure 1 in a first electrode region 91 on a first side of the silicon substrate 9 through a patterning process.

At S102, forming a second passivation structure 2 in a second electrode region 92 on a first side of the silicon substrate 9 through the patterning process.

At S103, forming a first electrode 81 in the first electrode region 91 and a second electrode 82 in the second electrode region 92 on the first side of the silicon substrate 9 through the patterning process.

To prepare the solar cell, the first passivation structure 1 in the first electrode region 91 and the second passivation structure 2 in the second electrode region 92 may be sequentially formed on the first side of the silicon substrate 9 through a patterning process; and then the first electrode 81 and the second electrode 82 in the first electrode region 91 and the second electrode region 92 are formed, respectively.

It will be appreciated that the above is merely an exemplary introduction of the method for preparing a solar cell according to the embodiments of the present disclosure, and the method according to the embodiments of the present disclosure may further satisfy other characteristics.

For example, the silicon substrate 9 may be formed through a czochralski method (CZ), a float zone method (FZ), a casting method, or the like.

For another example, the silicon substrate 9 may be cleaned and polished before being subjected to any other step.

For another example, when the second side (light incident side) of the silicon substrate 9 is textured, the texture may be formed through wet chemical texturing, dry reactive ion etching (RIE), or the like.

For another example, the front dielectric passivation layer 31 as described above may be formed on the second side of the silicon substrate 9 through plasma enhanced chemical vapor deposition (PECVD), hot wire chemical vapor deposition (HWCVD), or the like.

For another example, the antireflection layer 32 (protective layer) as described above may be further formed on the second side of the silicon substrate 9 through PECVD or the like.

For another example, when the first passivation structure 1 is prepared, a complete first passivation structure 1 may be formed first, and then patterned to remove the first passivation structure 1 from the second electrode region 92. The complete first passivation structure 1 may be formed by any one of the following methods.

(1) Forming the tunneling passivation sublayer 11 and the intrinsic a-Si layer sequentially through a low pressure chemical vapor deposition (LPCVD) process, and then doping the intrinsic a-Si layer through high temperature diffusion (e.g., phosphorous diffusion or boron diffusion) to form the first passivation sublayer 12.

Since the diffusion environment contains oxygen, a very thin PSG (silicon oxide containing phosphorus) or BSG (silicon oxide containing boron) structure is synchronously formed on the surface of the first passivation sublayer 12, and may be used as a mask in subsequent processes.

(2) Forming the tunneling passivation sublayer 11 and an in-situ doped amorphous silicon layer sequentially through an LPCVD process, then crystalizing the in-situ doped amorphous silicon layer into polysilicon through high temperature annealing or excimer laser annealing (ELA), and activating the doped element so that the in-situ doped amorphous silicon layer forms the first passivation sublayer 12.

In the high temperature annealing process, a proper amount of oxygen ($O_2$) may be simultaneously introduced so that a PSG (or BSG) structure is synchronously formed on the surface of the first passivation sublayer 12 and serves as a mask in subsequent processes.

(3) Forming the tunneling passivation sublayer 11, an in-situ doped amorphous silicon layer and a silicon oxynitride layer sequentially through a PECVD process, then crystalizing the in-situ doped amorphous silicon layer into polysilicon through high temperature annealing or ELA, and activating the doped element so that the in-situ doped amorphous silicon layer forms the first passivation sublayer 12.

The silicon oxynitride layer does not belong to the first passivation structure 1, but serves as a mask in subsequent processes.

(4) Forming the tunneling passivation sublayer 11 and an in-situ doped amorphous silicon layer sequentially through a PECVD process, then crystalizing the in-situ doped amorphous silicon layer into polysilicon through high temperature annealing or ELA, and activating the doped element so that the in-situ doped amorphous silicon layer forms the first passivation sublayer 12.

In this method, no mask is formed.

For another example, when formed, the complete first passivation structure 1 may be patterned by any one of the following modes.

Mode I: when the first passivation structure 1 is formed by any one of the above methods (1) to (3), a mask of a PSG (or BSG) structure, a silicon oxynitride layer, or the like is provided, so the mask on the second electrode region 92 may be removed through laser film opening, and then the first passivation structure 1 is removed from the second electrode region 92 through wet etching, while the first passivation structure 1 in the first electrode region 91 is protected by the mask and not etched, thereby completing patterning of the first passivation structure 1. Thereafter, the mask on the first electrode region 91 is removed.

Mode II: when the first passivation structure 1 is formed by the above method (4) and including no mask, ink may be formed on the first electrode region 91 through inkjet printing as a mask, and then the first passivation structure 1 is removed from the second electrode region 92 through wet etching. Thereafter, the ink mask on the first electrode region 91 is removed.

It can be seen that when the complete first passivation structure 1 is formed according to the above modes I and II, it is equivalent that a mask (for patterning the first passivation structure 1) is formed at the same time of preparing the first passivation structure 1, and thus, a separate step of preparing the mask is omitted, which simplifies the process, and can further reduce one process of preparing the mask (such as forming ink).

It can be seen that when the complete first passivation structure 1 is formed according to the above mode I, in the process of forming the first passivation sublayer 12, the diffused element therein can further form a phosphorus or boron diffusion layer on the second side of the silicon substrate 9 synchronously, which plays a role of phosphorus or boron gettering. Further, the diffusion layer can be naturally removed during the subsequent patterning (wet etching) of the first passivation structure 1, so that no additional process is required, and the structure on the second side of the silicon substrate 9 will not be changed.

For another example, depending on property requirements of the surface of the silicon substrate 9 in the second electrode region 92, a corresponding wet etching process may be selected so that while the first passivation structure 1 is patterned, the surface of the second electrode region 92 of the silicon substrate 9 is also formed into a polished surface, a micro-textured surface, a textured surface, or the like.

For another example, if the surface of the second electrode region 92 of the silicon substrate 9 is desired to be formed into a textured surface while the first passivation structure 1 is patterned, the textured surface on the second side of the silicon substrate 9 may also be formed synchronously.

For another example, a complete second passivation structure 2 may be formed through physical vapor deposition (PVD), rapid plasma deposition (RPD), or the like, then ink is formed on the second electrode region 92 through inkjet printing as a mask, and the second passivation structure 2 is removed from the first electrode region 91 by wet etching, thereby obtaining a patterned second passivation structure 2.

For another example, while the second passivation sublayer 22 of the second passivation structure 2 is doped (with boron, for example), elements such as oxygen (O), carbon (C), nitrogen (N), and the like may also be used, so as to further widen the band gap, improve the doping quality, and reduce the optical absorption.

For another example, the transparent conductive oxide layer 89 as described above may be further formed on the first side of the silicon substrate 9 through PVD, RPD, or the like, and the transparent conductive oxide layer 89 in the first electrode region 91 and the second electrode region 92 may be separated through a mask and wet etching, laser etching, etchant etching, or the like.

For another example, when the second passivation sublayer 22 is made of an amorphous silicon material, the transparent conductive oxide layer 89 in the first electrode region 91 may be completely removed through laser etching, and the amorphous silicon in the second passivation sublayer 22 on the surface of the first electrode region 91 is crystallized by the energy of laser to reduce a tunneling resistance of the tunneling junction.

For another example, the first electrode 81 and the second electrode 82 may be disposed in a same layer, and formed simultaneously through screen printing, electroplating, PVD (e.g., vapor deposition), or the like.

EXAMPLE 1

A method for preparing a solar cell according to an embodiment of the present disclosure specifically includes the following steps A101 to A112.

Figure 6:
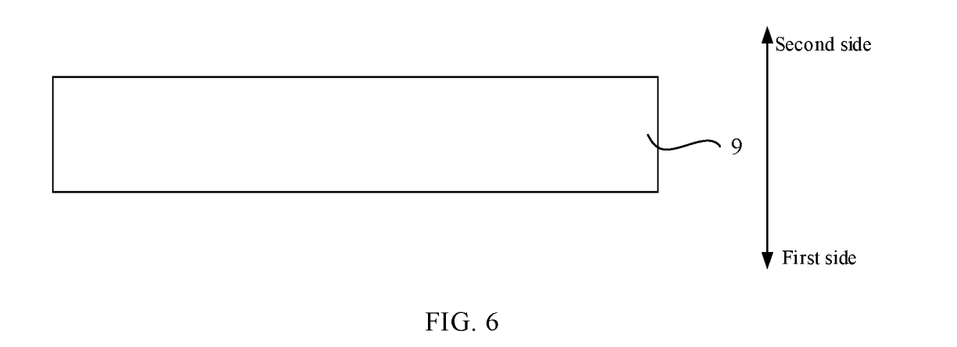
FIG. 6 is a schematic sectional view of a silicon substrate used in a method for preparing a solar cell according to an embodiment of the present disclosure.

At A101, cleaning and polishing an N-type (first polarity) silicon wafer (silicon substrate 9), to obtain the structure shown in FIG. 6.

At A102, sequentially forming a silicon oxide tunneling layer (tunneling passivation sublayer 11) and an intrinsic a-Si layer on a back side (first side) of the silicon wafer by LPCVD, and forming N-type (first polarity) doping on the intrinsic a-Si layer through subsequent high-temperature phosphorus diffusion, to obtain an N-type amorphous silicon layer (first passivation sublayer 12), and synchronously growing PSG as a mask on the surface.

The silicon oxide tunneling layer has a thickness of 1.5 nm, and the N-type amorphous silicon layer has a thickness of 120 nm.

It can be seen that in the embodiment of the present disclosure, the case where the first passivation structure 1 and the silicon substrate 9 have a same polarity (first polarity) is taken as an example for explanation. It will be appreciated that it is also feasible if the first passivation structure 1 has an opposite polarity to the silicon substrate 9, and the second passivation structure 2 has the same polarity as the silicon substrate 9.

At A103, forming a textured surface on a light incident side (second side) of the silicon wafer through wet chemical texturing.

At A104, forming an amorphous silicon passivation layer (front dielectric passivation layer 31) on the light incident side of the silicon wafer through PECVD.

Figure 7:
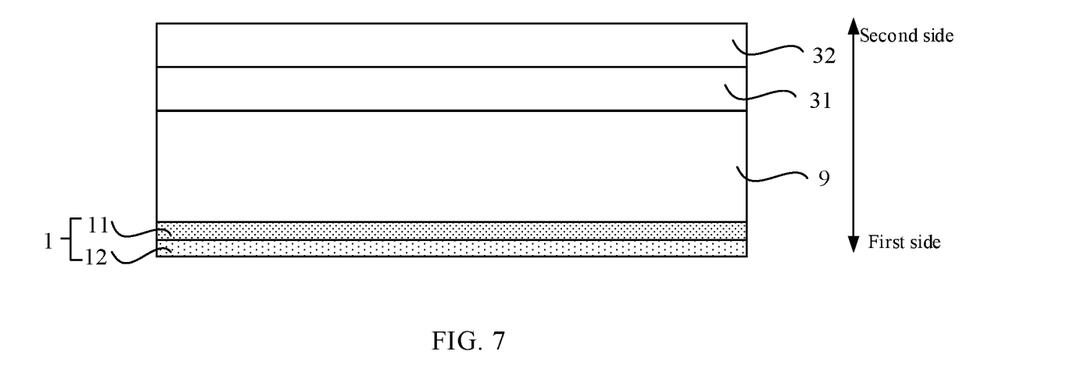
FIG. 7 is a schematic sectional view when an antireflection layer is formed in a method for preparing a solar cell according to an embodiment of the present disclosure.

At A105, forming an AR film (antireflection layer 32) of a stack of silicon oxide and silicon nitride through PECVD on the light incident side of the silicon wafer, to obtain the structure shown in FIG. 7.

At A106, removing the PSG mask on the N-type amorphous silicon surface in the second electrode region 92 by laser film opening.

Figure 8:
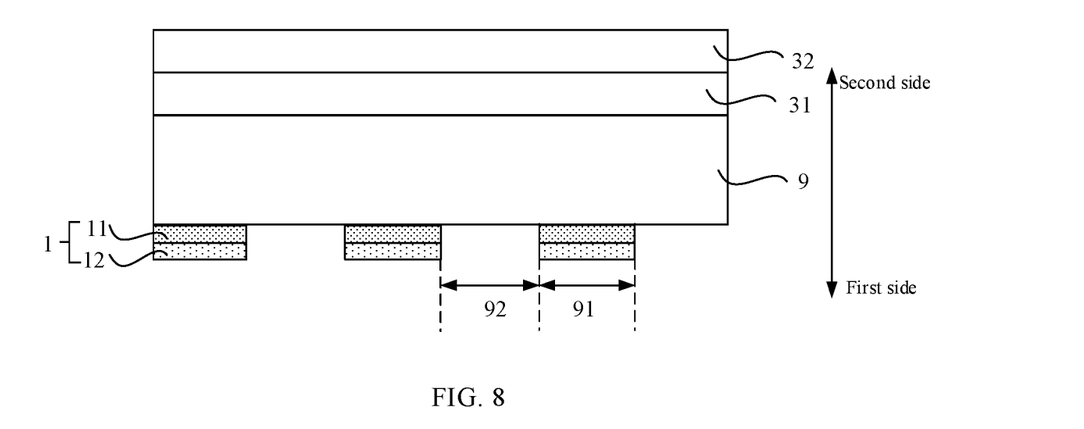
FIG. 8 is a schematic sectional view when a first passivation structure is patterned in a method for preparing a solar cell according to an embodiment of the present disclosure.

At A107, removing the N-type amorphous silicon layer and the silicon oxide tunneling layer in the second electrode region 92 by wet etching, while forming a surface of the second electrode region 92 on the back side of the silicon wafer into a micro-textured surface, to obtain a patterned N-type amorphous silicon layer and a patterned silicon oxide tunneling layer (first passivation structure 1).

Thereafter, the PSG mask is removed by wet etching to obtain the structure shown in FIG. 8.

At A108, successively forming full-area intrinsic a-Si (dielectric passivation sublayer 21) and boron-doped P-type (second polarity) amorphous silicon (second passivation sublayer 22) on the back side of the silicon wafer through RPD, i.e., forming a second passivation structure 2.

The intrinsic a-Si layer may have a thickness of 10 nm, and the P-type amorphous silicon layer may have a thickness of 12 nm.

Figure 9:
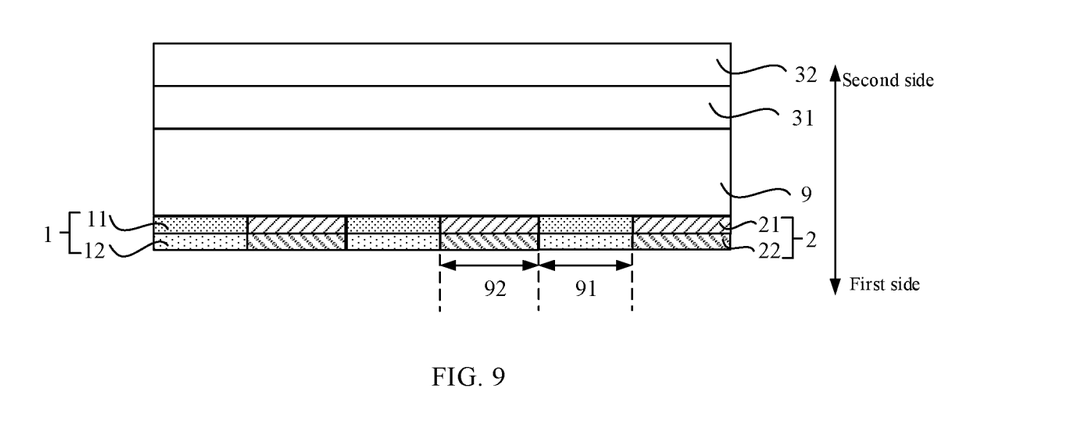
FIG. 9 is a schematic sectional view when a second passivation structure is patterned in a method for preparing a solar cell according to an embodiment of the present disclosure.

At A109, forming ink as a mask on the P-type amorphous silicon surface of the second electrode region 92 through inkjet printing, performing wet etching to remove the intrinsic a-Si and the P-type amorphous silicon in the first electrode region 91, to obtain the second passivation structure 2 in the second electrode region 92, and then removing the ink in the second electrode region 92 to obtain the structure shown in FIG. 9.

At A110, forming an ITO layer (transparent conductive oxide layer 89) on the back side of the silicon wafer through PVD.

At A111, removing the ITO layer at an interface of the first electrode region 91 and the second electrode region 92 through laser etching, i.e., separating the ITO layers corresponding to the first electrode 81 and the second electrode 82, respectively.

At A112, forming silver electrodes (the first electrode 81 and the second electrode 82) respectively in the first electrode region 91 and the second electrode region 92 on the back side of the silicon wafer through screen printing, to obtain the structure shown in FIG. 3.

The solar cell according to the embodiment of the present disclosure is subjected to performance test, and has a photoelectric conversion efficiency of 25.4%.

Therefore, the solar cell according to the embodiment of the present disclosure has excellent performance.

EXAMPLE 2

A method for preparing a solar cell according to an embodiment of the present disclosure, which is similar to that of example 1.

The difference lies in that in example 2, steps A106 and A107 are performed directly after step A102.

In the patterning of step A107, a textured surface is formed in the second electrode region 92 on the back side of the silicon wafer, while the surface on the light incident side of the silicon wafer is also formed into a textured surface, so that the light incident side of the silicon wafer does not need to be specially textured, that is, the step A103 can be omitted, and steps A104, A105, A108, A109, A110 and A111 can be continuously and sequentially performed.

The solar cell according to the embodiment of the present disclosure is subjected to performance test, and has a photoelectric conversion efficiency of 25.5%.

Therefore, the solar cell according to the embodiment of the present disclosure has excellent performance, and the preparation process is further simplified.

It will be appreciated that the above implementations are merely exemplary implementations for the purpose of illustrating the principle of the present disclosure, and the present disclosure is not limited thereto. It will be apparent to one of ordinary skill in the art that various modifications and variations may be made without departing from the spirit or essence of the present disclosure. Such modifications and variations should also be considered as falling into the protection scope of the present disclosure.

What is claimed is:

1. A solar cell, comprising:
    a silicon substrate having a first polarity or a second polarity, wherein the silicon substrate includes a first side and a second side opposite to each other; the first polarity is used for transporting one of electrons and holes, and the second polarity is used for transporting the other of electrons and holes;
    a first passivation structure on the first side of the silicon substrate, wherein a portion of the first passivation structure farthest from the silicon substrate has a first polarity; and a position where the first passivation structure is located is a first electrode region;
    a second passivation structure on a side of the first passivation structure away from the silicon substrate, wherein a portion of the second passivation structure farthest from the silicon substrate has a second polarity; and a position where the second passivation structure is located is a second electrode region, the second electrode region is not overlapped with the first electrode region, and the second passivation structure has a process temperature lower than the first passivation structure; and
    a first electrode in the first electrode region on a side of the first passivation structure away from the silicon substrate, and a second electrode in the second electrode region on a side of the second passivation structure away from the silicon substrate;
    wherein the second passivation structure is not overlapped with the first passivation structure in a direction perpendicular to the first side or the second side, and side surfaces of the first passivation structure and the second passivation structure contact each other, and the first passivation structure completely covers, but does not exceed, the first electrode region, and the second passivation structure completely covers, but does not exceed, the second electrode region, and
    wherein the first passivation structure comprises a tunneling passivation sublayer and a first passivation sublayer on a side of the tunneling passivation sublayer away from the silicon substrate; the second passivation structure comprises a dielectric passivation sublayer and a second passivation sublayer on a side of the dielectric passivation sublayer away from the silicon substrate; side surfaces of the tunneling passivation sublayer and the first passivation sublayer contact with the second passivation structure; and side surfaces of the dielectric passivation sublayer and the second passivation sublayer contact with the first passivation structure wherein the tunneling passivation sublayer and the dielectric passivation sublayer comprise different materials.

2. The solar cell according to claim 1,
    wherein the portion of the first passivation structure farthest from the silicon substrate is the first passivation sublayer.

3. The solar cell according to claim 2, wherein
    the tunneling passivation sublayer is made of a material comprising at least one of silicon oxide, aluminum oxide, silicon oxynitride or silicon carbide; and
    the first passivation sublayer is made of a material comprising at least one of doped polysilicon or doped silicon carbide.

4. The solar cell according to claim 2, wherein
the tunneling passivation sublayer has a thickness ranging from 1 nm to 3 nm; and
the first passivation sublayer has a thickness ranging from 10 nm to 200 nm.

5. The solar cell according to claim 1,
wherein the portion of the second passivation structure farthest from the silicon substrate is the second passivation sublayer.

6. The solar cell according to claim 5, wherein
the dielectric passivation sublayer is made of a material comprising at least one of polysilicon, amorphous silicon or silicon oxide; and
the second passivation sublayer is made of a material comprising at least one of doped polysilicon, doped amorphous silicon or doped silicon carbide.

7. The solar cell according to claim 5, wherein
the dielectric passivation sublayer has a thickness ranging from 1 nm to 15 nm; and
the second passivation sublayer has a thickness ranging from 1 nm to 20 nm.

8. The solar cell according to claim 1, wherein
the first electrode region includes a plurality of strip-shaped regions spaced apart, the second electrode region includes a plurality of strip-shaped regions spaced apart, and the strip-shaped regions in the first electrode region and the strip-shaped regions in the second electrode region are alternately distributed.

9. The solar cell according to claim 1, wherein
the first passivation structure has a process temperature ranging from 300° C. to 650° C.; and
the second passivation structure has a process temperature ranging from 150° C. to 200° C.

10. A method for preparing a solar cell, wherein the solar cell is a solar cell according to claim 1, and the method comprises:
forming the first passivation structure in the first electrode region on the first side of the silicon substrate through a patterning process;
forming the second passivation structure in the second electrode region on the first side of the silicon substrate through the patterning process; and
forming the first electrode in the first electrode region and the second electrode in the second electrode region on the first side of the silicon substrate through the patterning process.

11. The method according to claim 10, wherein the first passivation structure comprises:
a tunneling passivation sublayer; and
a first passivation sublayer on a side of the tunneling passivation sublayer away from the silicon substrate, wherein the portion of the first passivation structure farthest from the silicon substrate is the first passivation sublayer.

12. The method according to claim 11, wherein
the tunneling passivation sublayer is made of a material comprising at least one of silicon oxide, aluminum oxide, silicon oxynitride or silicon carbide; and
the first passivation sublayer is made of a material comprising at least one of doped polysilicon or doped silicon carbide.

13. The method according to claim 11, characterized in that
the tunneling passivation sublayer has a thickness ranging from 1 nm to 3 nm; and
the first passivation sublayer has a thickness ranging from 10 nm to 200 nm.

14. The method according to claim 10, wherein the second passivation structure comprises:
a dielectric passivation sublayer; and
a second passivation sublayer on a side of the dielectric passivation sublayer away from the silicon substrate, wherein the portion of the second passivation structure farthest from the silicon substrate is the second passivation sublayer.

15. The method according to claim 14, wherein
the dielectric passivation sublayer is made of a material comprising at least one of polysilicon, amorphous silicon or silicon oxide; and
the second passivation sublayer is made of a material comprising at least one of doped polysilicon, doped amorphous silicon or doped silicon carbide.

16. The method according to claim 14, wherein
the dielectric passivation sublayer has a thickness ranging from 1 nm to 15 nm; and
the second passivation sublayer has a thickness ranging from 1 nm to 20 nm.

17. The method according to claim 10, wherein
the first electrode region includes a plurality of strip-shaped regions spaced apart, the second electrode region includes a plurality of strip-shaped regions spaced apart, and the strip-shaped regions in the first electrode region and the strip-shaped regions in the second electrode region are alternately distributed.

18. The method according to claim 10, wherein
the first passivation structure has a process temperature ranging from 300° C. to 650° C.; and
the second passivation structure has a process temperature ranging from 150° C. to 200° C.

* * * * *